(12) United States Patent
Richt

(10) Patent No.: US 9,077,337 B2
(45) Date of Patent: Jul. 7, 2015

(54) ELECTRONIC SWITCH WITH COMPENSATION OF NON-LINEAR DISTORTIONS

(71) Applicant: Rohde & Schwarz GmbH & Co. KG, Munich (DE)

(72) Inventor: Bernhard Richt, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 13/900,003

(22) Filed: May 22, 2013

(65) Prior Publication Data

US 2014/0347118 A1 Nov. 27, 2014

(30) Foreign Application Priority Data

May 22, 2013 (DE) .......................... 10 2012 208 529

(51) Int. Cl.
*H03K 17/687* (2006.01)
*H03K 17/16* (2006.01)
*H03K 17/76* (2006.01)
*H04B 1/48* (2006.01)

(52) U.S. Cl.
CPC .............. *H03K 17/16* (2013.01); *H03K 17/76* (2013.01); *H04B 1/48* (2013.01); *H03K 2217/0054* (2013.01)

(58) Field of Classification Search
CPC ........... H03H 7/24; H03H 7/25; H03H 7/253; H03H 7/255; H03K 17/16; H03K 17/76; H03K 2217/0054; H04B 1/48

USPC ........................... 327/434, 436–437; 333/103
See application file for complete search history.

(56) References Cited

U.S. PATENT DOCUMENTS

| | | | | |
|---|---|---|---|---|
| 4,097,827 A * | 6/1978 | Williams | ..................... | 333/81 R |
| 5,834,988 A * | 11/1998 | Dobrovolny | ................ | 333/81 R |
| 6,496,083 B1 * | 12/2002 | Kushitani et al. | ............. | 333/103 |
| 6,919,774 B2 * | 7/2005 | Ritchey et al. | ............. | 333/81 R |
| 7,023,294 B2 * | 4/2006 | Hauger et al. | ............... | 333/81 R |
| 7,898,359 B2 * | 3/2011 | Darriet et al. | ................. | 333/103 |

FOREIGN PATENT DOCUMENTS

| | | |
|---|---|---|
| DE | 3047869 C1 | 5/1982 |
| DE | 10305361 A1 | 5/2004 |
| EP | 004645 A2 | 6/1982 |
| GB | 1108671 A | 3/1968 |
| JP | 0722935 A | 1/1995 |

* cited by examiner

*Primary Examiner* — Kenneth Wells
(74) *Attorney, Agent, or Firm* — Ditthavong & Steiner, P.C.

(57) ABSTRACT

An electronic switch contains an input terminal, and output terminal and at least one first switch element, which provides a voltage-dependent characteristic. In this context, the first switch element connects the input terminal to the output terminal in a selective manner. The electronic switch further comprises a compensation element, which provides a voltage-dependent characteristic. In this context, the compensation element is arranged in such a manner that it at least partially compensates the frequency-dependent characteristic of the switch element.

14 Claims, 3 Drawing Sheets

ELECTRONIC SWITCH WITH COMPENSATION OF NON-LINEAR DISTORTIONS

FIELD OF THE INVENTION

The invention relates to an electronic switch, preferably a high-frequency switch, which causes only very slight non-linear distortions.

BACKGROUND OF THE INVENTION

PIN diode switches are used conventionally for switching high-frequency signal branches. The switches in the signal branches are conventionally realised by a combination of longitudinal switch elements and transverse switch elements. In the simplest case, such a signal branch comprises one longitudinal switch element and one transverse switch element. The transverse elements are conventionally connected to ground directly or via a block capacitor. The signal transmission within the transmission frequency range should be impaired as little as possible by the switch elements. Linear impairments are, for example, the transmission loss and error matching of such switches in the conductive pathway and the finite insulation in the disabled pathway. Non-linear impairments are level-dependent signal distortions, for example, through second-order and third-order intermodulations.

The minority-carrier lifetime of a conductive PIN diode and the current through the conductive PIN diode determine the lower high-frequency frequency limit for the use of such a switching element. If field-effect transistors are used as the switch element instead of PIN diodes, the high-frequency resistance is modulated by a connected high-frequency voltage. A variation of the blocking capacitance of a blocked PIN diode by the high-frequency voltage superposed on the blocking voltage causes non-linear distortions. In turn, if field-effect transistors are used as the switch elements, varying the blocking capacitance of blocked transverse field-effect transistors also has an influence in the form of non-linear signal distortions as a result of the high-frequency voltage superposed on the blocking voltage.

Accordingly, for example, DE 30 47 869 C1 shows a PIN-diode switch which provides the above-named disadvantages.

The invention is based upon the object of providing an electronic switch, especially for high-frequency signals, which causes only very slight non-linear distortions.

SUMMARY OF THE INVENTION

An electronic switch according to the invention contains an input terminal, an output terminal and at least one first switch element, which provides a voltage-dependent transmission characteristic. In this context, the first switch element connects the input terminal to the output terminal in a selective manner. The electronic switch further comprises a compensation element which provides a voltage-dependent transmission characteristic. The compensation element is arranged here in such a manner that it at least partially compensates the voltage-dependent transmission characteristic of the first switch element. Accordingly, a reduction of the distortions through the switch is possible.

By preference, the first switch element is a transverse element leading to ground from the connection between the input terminal and the output terminal. The first switch element is then preferably controllable from the control terminal. In this manner, the electronic switch can be realised with few structural elements.

The electronic switch preferably comprises a second switch element which is a series element between the input terminal and the output terminal. In this context, the second switch element is preferably also controllable from the control terminal. Accordingly, a favourable switching behaviour can be realised with few structural elements.

The compensation element is preferably a transverse element leading to ground from a connection between the input terminal and the output terminal. The compensation element is then preferably supplied with a compensation voltage from a compensation terminal. In this manner, distortions, especially non-linear distortions, can be compensated at low cost.

The input terminal is preferably supplied with a direct voltage from a direct-voltage terminal. In this manner, a forward bias of the input terminal can be realised by simple means.

By preference, the first switch element is a semiconductor component, preferably a PIN diode, or a transistor, preferably a field-effect transistor, or a micro-mechanical switch. In this manner, the first switch element can be realised with readily available standard components.

By preference, the second switch element is a semiconductor component, preferably a PIN diode or a transistor, preferably a field-effect transistor, or a micro-mechanical switch. In this manner, the second switch element can be realised with readily available standard components.

By preference, the compensation element is a semiconductor component, preferably a PIN diode or a transistor, preferably a field-effect transistor, or a micro-mechanical switch. In this manner, the compensation element can be realised with readily available standard components.

The first switch element and the compensation element preferably belong to the same component class. By particular preference, the first switch element and the compensation element are identical in structure. In this manner, an optimal compensation of distortions can be achieved.

By preference, the compensation element of the first switch element is mounted at the same location along the signal pathway of the RF signal as the first switch element in order to achieve a phase-correct compensation of the non-linear distortions for all RF frequencies.

To achieve good compensation at a given frequency, it is advantageous to arrange the compensation element of the first switch element at a spacing distance of a multiple of half a wavelength from the location of the first switch element.

An electronic two-way switch comprises a first and a second electronic switch as described above and a common input terminal which is connected to the input terminals of the electronic switches. In this manner, a two-way switching between two outputs can be realised by simple means.

By preference, the electronic two-way switch is embodied in such a manner that a high-frequency signal supplied at the common input terminal is optionally connected to an output terminal of the first electronic switch or to an output terminal of the second electronic switch. In this manner, a secure separation of the two output terminals is guaranteed.

The first switch element of the first electronic switch and the first switch element of the second electronic switch preferably belong to the same component class and are, by particular preference, identical in structure. In this manner, a particularly symmetrical functioning of the two-way switch can be achieved.

By preference, the compensation element of the first electronic switch and the compensation element of the second electronic switch belong to the same component class. By particular preference, they are identical in structure. In this manner, a particularly good compensation can be achieved.

BRIEF DESCRIPTION OF THE DRAWINGS

The invention is described in the following paragraphs by way of example with reference to the drawings in which advantageous exemplary embodiments of the invention are illustrated. The drawings show the following.

DETAILED DESCRIPTION OF EMBODIMENTS

Initially, the structure and method of functioning of an exemplary electronic switch without compensation of non-linear distortions will be described with reference to FIG. 1 and FIG. 2. The structure and method of functioning of a first exemplary embodiment of the electronic switch according to the invention will then be explained with reference to FIG. 3 and FIG. 4. Finally, with reference to FIG. 5, the structure and method of functioning of an electronic two-way switch which is structured with a combination of two electronic switches according to the invention is described. The presentation and description of identical elements in similar drawings have not been repeated in some cases.

Figure 1:
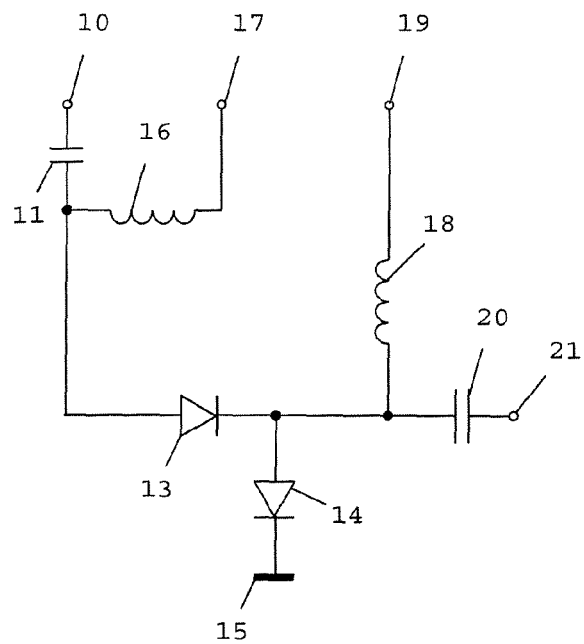
FIG. 1 an exemplary electronic switch.
Figure 2:
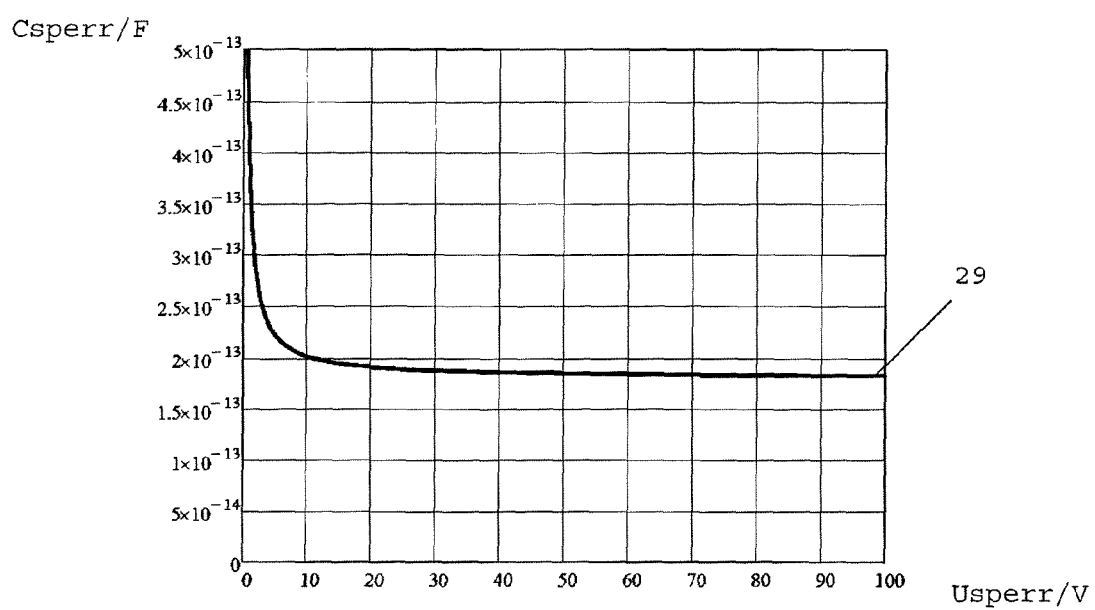
FIG. 2 a characteristic of an exemplary electronic switch.

FIG. 1 shows an exemplary electronic switch. This provides an input terminal 10 and an output terminal 21. A block capacitor 11 is connected to the input terminal 10. A PIN diode 13, which is again connected at its second end via a block capacitor 20 to the output terminal 21, is connected to the terminal of the block capacitor 11 facing away from the input terminal 10. Accordingly, the PIN diode 13 is a longitudinal switch element. A further PIN diode 14 is connected to the end of the PIN diode 13 facing towards the output terminal 21. This PIN diode 14 is connected at its remote end to a ground terminal 15. Moreover, an inductance 18, which is connected to a control terminal 19, is connected to the end of the PIN diode 13 facing towards the output terminal 21. The end of the PIN diode 13 facing towards the input terminal 10 is also connected via an inductance 16 to a direct voltage terminal 17.

The PIN diode 14 is a first switch element. The PIN diode 13 is a second switch element. In this context, the PIN diode 13 is polarised in the flow direction from the input terminal 10 to the output terminal 21. Accordingly, the PIN diode 14 is polarised in the flow direction towards the ground terminal 15. As an alternative, both diodes 13, 14 can thus also be polarised in the inverse manner.

Alternatively, if all of the diodes are inverted (anode and cathode reversed), the same function is obtained as already described.

A negative direct voltage is permanently connected to the direct-voltage terminal 17. Alternatively, the terminal can be permanently disposed at ground potential. The inductance 16 allows the direct-voltage signal of the direct-voltage terminal 17 to pass unhindered, but prevents the high-frequency signal from draining into the direct-voltage terminal 17. Similarly, the block capacitor 11 prevents the direct voltage from draining into the input terminal 10, but does not prevent the high-frequency signal from entering the electronic switch.

If a more negative voltage is connected to the control terminal 19 than to the direct-voltage terminal 17, the PIN diode 13 is then conductive. A high-frequency signal supplied to the input terminal 10 accordingly overcomes the PIN diode 13 and is available at the output terminal 21. In this context, the PIN diode 14 is blocked because, via the control terminal 19, a negative control voltage is opposed to the ground signal at the ground terminal 15. Accordingly, the high-frequency signal does not drain via the ground terminal 15. Moreover, it cannot drain via the control terminal 19, because it cannot pass the inductance 18.

By contrast, if a more positive direct-voltage signal is connected to the control terminal 19 than to the direct-voltage terminal 17, the PIN diode 13 is blocked, while the PIN diode 14 is conductive. A high-frequency signal connected to the input terminal 10 cannot now pass the PIN diode 13 and is additionally short-circuited to ground by the diode 13.

However, in this context, the PIN diodes used, especially the transverse switch element, PIN diode 14, provide a voltage-dependent capacitance. FIG. 2 shows the capacitance of the PIN diode 14 plotted against the applied blocking voltage as a characteristic 29. It is clearly evident here that with a small blocking voltage, a large capacitance occurs, and with a large blocking voltage, a small capacitance occurs. This leads to non-linear distortions of the high-frequency signal connected from the switch.

Figure 3:
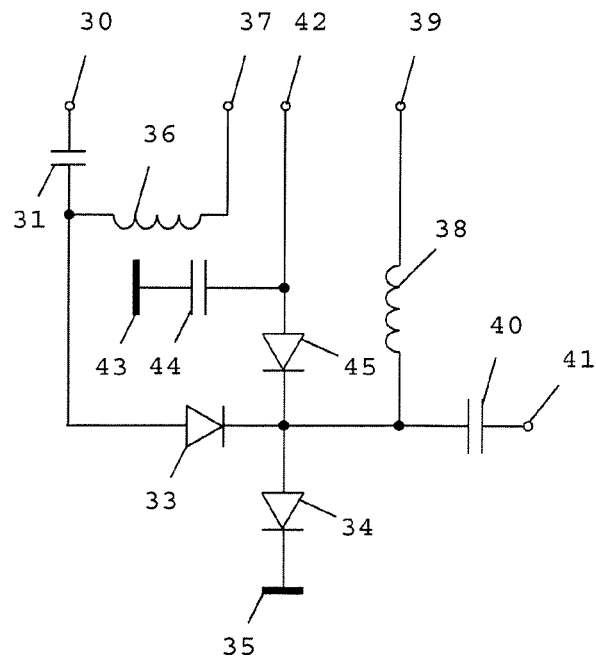
FIG. 3 a first exemplary embodiment of the electronic switch according to the invention.

FIG. 3 shows a first exemplary embodiment of the electronic switch according to the invention in a circuit diagram. The illustration corresponds largely to the illustration from FIG. 1. The electronic switch comprises an input terminal 30 and an output terminal 41. The input terminal 30 is connected via a block capacitor 31 to a PIN diode 33. The PIN diode 33 is connected via a further block capacitor 40 to the output terminal 41. In this context, the PIN diode 33 is polarised in the flow direction from the block capacitor 31 to the block capacitor 40.

The input terminal of the PIN diode 33 is additionally connected via an inductance 36 to a direct-voltage terminal 37. The output terminal of the PIN diode 33 is further connected via an inductance 38 to a control terminal 39. Moreover, the output terminal of the PIN diode 33 is connected by means of a further PIN diode 34 to a ground terminal 35. In this context, the PIN diode 34 is polarised in the flow direction towards the ground terminal 35. The structural elements explained so far correspond to the structural elements illustrated in FIG. 1. The function of these structural elements is also identical.

Additionally, in this exemplary embodiment, the switch according to the invention contains a compensation element, here, a PIN diode 45, which is also connected to the output terminal of the PIN diode 33. Its remote end is connected to a compensation terminal 42. Viewed from this compensation terminal 42, the diode 45 has the same polarity as the diode 34. Moreover, its remote end is connected to a ground terminal 43 via a block capacitor 44.

A negative direct voltage signal, of which the magnitude initially corresponds to approximately double the voltage at the control terminal 39, is permanently provided via the compensation terminal 42. A negative direct voltage is also permanently present at the direct-voltage terminal 37 here. As an alternative, the terminal 37 is disposed at ground potential.

Accordingly, if a more negative voltage is applied to the control terminal 39 than to the terminal 37, a current will flow from the terminal 37 to the control terminal 39. Accordingly, the PIN diode 33 is conductive. A high-frequency signal can therefore flow from the input terminal 30 to the output terminal 41. Since the PIN diode 34 receives a negative voltage via terminal 39, it is blocked. The high-frequency signal can therefore not drain to the ground terminal 35. Similarly, the high-frequency signal cannot drain to the control terminal 39, since it is prevented from this by the inductance 38.

Via the terminal 42, the block capacitor 44 is initially disposed at approximately double the negative direct voltage by comparison with terminal 39. For the high-frequency signal, the terminal 42 is short-circuited to ground via the block capacitor 44.

In this context, the compensation element, PIN diode 45, compensates the non-linear characteristic of PIN diode 34. This will be explained in greater detail with reference to FIG. 4.

By contrast, if a positive direct voltage is connected to the control terminal 39, this positive direct voltage is available at the output terminal of the PIN diode 33 in order to block the PIN diode 33. At the same time, the PIN diode 34 is conductive. That is, the high-frequency signal cannot flow from the input terminal 30 to the output terminal 41, and the diode 34 is additionally short-circuited to ground.

For example, a direct voltage of −50V, referred to below as the "blocking voltage" is to be available at the control terminal 39 from FIG. 3. −49 V are to be available at the control terminal 37. Accordingly, the PIN diode 33 is conductive. −100 V are to be available at the control terminal 42. Accordingly, the diode 34 and also the diode 45 are each blocked by the blocking voltage.

The RF momentary voltage, which is available at the PIN diode 34 and also at the PIN diode 45, acts on the two diodes in a different manner. For example, a positive RF amplitude increases the value of the momentary blocking voltage on the PIN diode 45 and reduces it on the PIN diode 34. As a result of this different action, the non-linear distortions are compensated.

Figure 4:
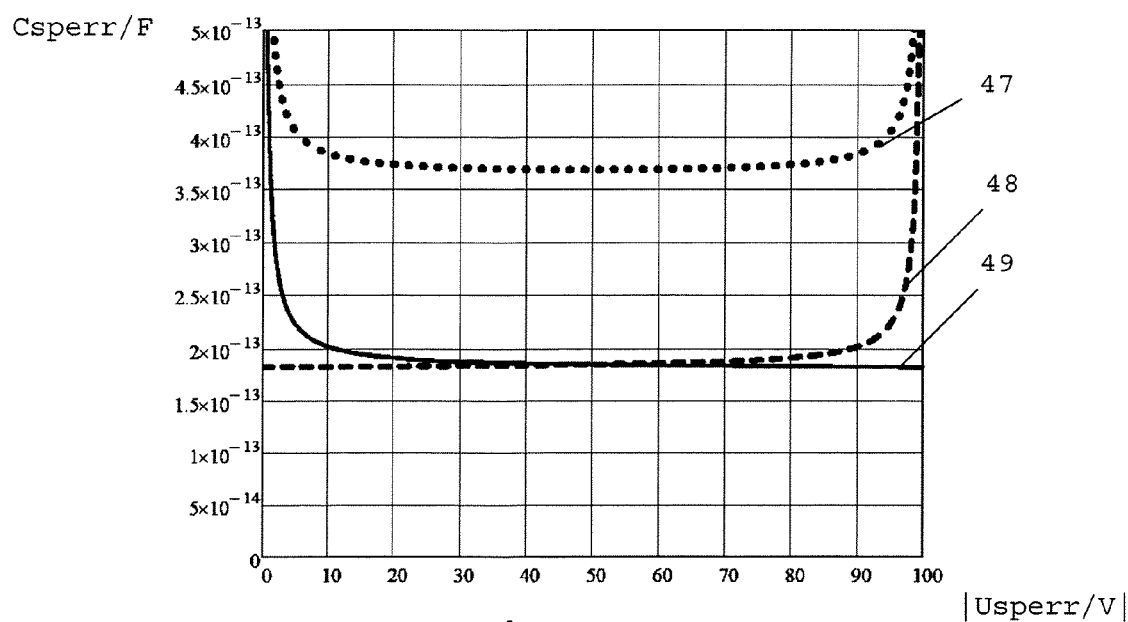
FIG. 4 several characteristics of the first exemplary embodiment of the electronic switch.

FIG. 4 illustrates the non-linear characteristics of the PIN diodes 34 and 45 from FIG. 3. In this context, the characteristic 49 corresponds to the PIN diode 34 and the characteristic 48 corresponds to the PIN diode 45. The characteristics 48 and 49 are summated to form a composite characteristic 47 which is symmetrical to the blocking voltage. Moreover, it is approximately independent from the blocking voltage over a broad range. This leads to a considerable reduction of non-linear distortions.

In order to balance component tolerances, the "doubled blocking voltage" at the terminal 42 from FIG. 3 can be calibrated in such a manner that the distortions are optimally suppressed. The voltage may be different dependent upon the frequency and level of the RF signal.

Instead of PIN diodes, field-effect transistors or micro-mechanical switches or any other switch elements which provide a non-linear characteristic can be used. By preference, the first switch element, PIN diode 34, here, is an identical component type to the compensation element, PIN diode 45 here. However, different component types can also be used as an alternative. A use of several structural elements as the compensation element is also conceivable. For example, two, three or more structural elements can be used as the compensation element.

Figure 5:
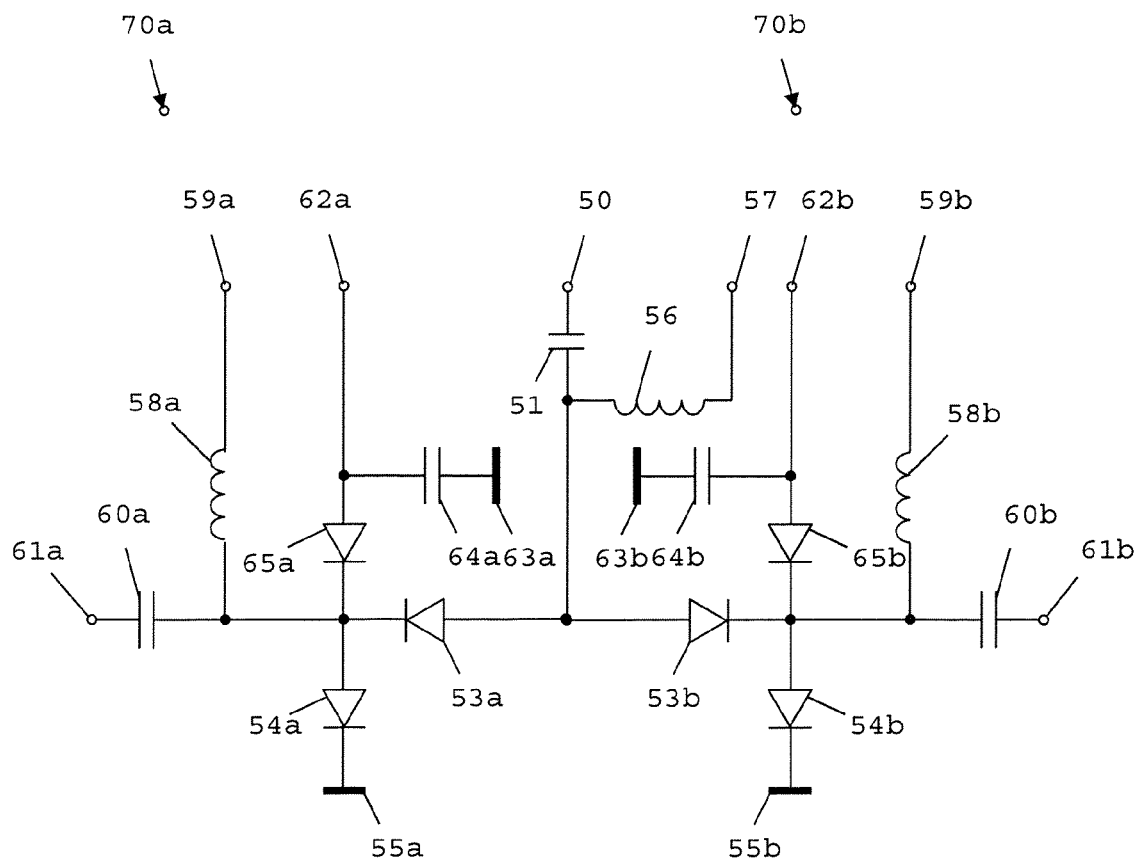
FIG. 5 a second exemplary embodiment of the electronic switch.

Finally, a second exemplary embodiment of the electronic switch according to the invention is shown with reference to FIG. 5. Here, two electronic switches, as illustrated in FIG. 3, are combined to form an electronic two-way switch. In this context, they provide a common input terminal 50. This is connected to a common block capacitor 51. Moreover, the output end of the block capacitor 51 is connected to a direct voltage terminal 57 by means of a common inductance 56. The components described so far correspond to the components illustrated in FIGS. 1 and 3.

Accordingly, a first switch 70a provides a compensation terminal 62a, a control terminal 59a and an output terminal 61a. A PIN diode 53a is connected in the flow direction to the output terminal of the common block capacitor 51 as a part of the first switch 70a. The output terminal of the PIN diode 53a is connected to a PIN diode 54a connected to a ground terminal 55a. This PIN diode 54a is also polarised in the flow direction. Moreover, the output terminal of the PIN diode 53a is connected to a PIN diode 65a which provides the reverse polarity. The remote terminal of this PIN diode 65a is connected to the compensation terminal 62a and to a block capacitor 64a which is connected to a ground terminal 63a. Moreover, the output terminal of the PIN diode 53a is connected by means of an inductance 58a to the control terminal 59a. Furthermore, the output terminal of the PIN diode 53a is connected by means of a block capacitor 60a to the output terminal 61a of the first switch 70a. The function of the first switch 70a corresponds to the function of the electronic switch illustrated in FIG. 3.

Moreover, a PIN diode 53b, which is part of the second switch 70b, is connected to the output terminal of the block capacitor 71. A further PIN diode 54b, which is also connected in the flow direction and connected to a ground terminal 55b, is connected to the output terminal of this PIN diode 53b, which is also connected in the flow direction. Moreover, a PIN diode 65b polarised in the blocking direction is connected to the output terminal of the PIN diode 53b. This is connected at its remote end to a compensation terminal 62b and via a block capacitor 64b to a ground terminal 63b. Moreover, the output terminal of the PIN diode 53b is connected via a block capacitor 60b to an output terminal 61b of the second switch 70b. Furthermore, the output terminal of the PIN diode 53b is connected via an inductance 58b to a control terminal 59b of the second switch 70b. The function of the second switch 70b also corresponds to the function of the electronic switch illustrated in FIG. 3.

During the operation of the electronic two-way switch according to FIG. 5, the control terminals 59a and 59b are preferably connected in an alternating manner. That is, only the first switch 70a or the second switch 70b is conductive or respectively blocked at the same time. Accordingly, a connection from the common input terminal 50 is provided at the same time only to the output terminal 61a or to the output terminal 61b. The respectively other output terminal 61a, 61b is at the same time connected to ground.

As a result of the compensation of the non-linear distortions by means of the compensation elements, the PIN diodes 65a, 65b, here, the high-frequency signal supplied is only minimally distorted by the electronic two-way switch.

The present invention is not restricted to the exemplary embodiment illustrated. As already mentioned, different switch elements can be used. In particular, the use of transistors, especially field-effect transistors or micro-mechanical switches is, for example, conceivable. These elements can also be used for the compensation elements. Moreover, it is also conceivable to use different component types for the switch elements and the compensation elements. All of the features described above or shown in the drawings can be advantageously combined with one another as required within the scope of the invention.

We claim:

1. An electronic switch comprising:
   an input terminal, an output terminal and a first switch element, which provides a voltage-dependent characteristic, wherein the first switch element includes a first diode transverse element, which is polarized in a flow direction toward a ground terminal and is capable of connecting the input terminal to the output terminal in a selective manner, depending on a voltage applied via a control terminal, and a compensation element, which provides a voltage-dependent characteristic, wherein the compensation element is arranged in such a manner that it at least partially compensates the voltage-dependent characteristic of the first switch element, wherein the compensation element is a transverse element, and further wherein the compensation element is reverse biased, wherein the control terminal controls the voltage at an interface of the first diode transverse element and the compensation element, and wherein the control terminal is connected directly to the interface of the first diode transverse element and the compensation element via an inductance.

2. The electronic switch according to claim 1,
wherein the first switch element leads to ground from a connection between the input terminal and the output terminal.

3. The electronic switch according to claim 1, further comprising:
a second switch element, which is a series element between the input terminal and the output terminal, and
wherein the second switch element is controllable from the control terminal.

4. The electronic switch according to claim 1,
wherein the compensation element leads to ground from a connection between the input terminal and the output terminal, and
wherein the compensation element is supplied with a compensation voltage from a compensation terminal.

5. The electronic switch according to claim 1, wherein the input terminal is supplied with a direct voltage from a direct voltage terminal.

6. The electronic switch according to claim 1, wherein the first switch element is a PIN diode.

7. The electronic switch according to claim 3,
wherein the second switch element is a semiconductor component, comprising one of a PIN diode, a transistor, or a field-effect transistor, or a micro-mechanical switch.

8. The electronic switch according to claim 1,
wherein the compensation element is a PIN diode.

9. The electronic switch according to claim 1,
wherein the first switch element and the compensation element have an identical structure.

10. The electronic switch according to claim 1,
wherein the first switch element and the compensation element are connected at least by one terminal each at a common location with reference to a signal flow between the input terminal and the output terminal.

11. An electronic two-way switch with a first electronic switch according to claim 1 and a second electronic switch according to claim 1 and a common input terminal, which is connected to the input terminals of the electronic switches.

12. The electronic two-way switch according to claim 11,
wherein the electronic two-way switch is embodied in such a manner that a high-frequency signal supplied at the common input terminal is selectively connected to an output terminal of the first electronic switch or to an output terminal of the second electronic switch.

13. The electronic two-way switch according to claim 11,
wherein the first switch element of the first electronic switch and the first switch element of the second electronic switch belong to the same component class and provide an identical structure.

14. The electronic two-way switch according to claim 11,
wherein the compensation element of the first electronic switch and the compensation element of the second electronic switch belong to the same component class and have an identical structure.

\* \* \* \* \*

UNITED STATES PATENT AND TRADEMARK OFFICE
CERTIFICATE OF CORRECTION

PATENT NO. : 9,077,337 B2
APPLICATION NO. : 13/900003
DATED : July 7, 2015
INVENTOR(S) : Bernhard Richt Page 1 of 1

It is certified that error appears in the above-identified patent and that said Letters Patent is hereby corrected as shown below:

On the title page, item 30, the Foreign Application Priority Data information reads:

"Foreign Application Priority Data
May 22, 2013 (DE) ......... 102012208529.7" should read "Foreign Application Priority Data
May 22, 2012 (DE) ......... 102012208529.7"

Signed and Sealed this
Fifteenth Day of December, 2015

Michelle K. Lee
*Director of the United States Patent and Trademark Office*